United States Patent
Noguchi

(10) Patent No.: US 11,682,468 B2
(45) Date of Patent: *Jun. 20, 2023

(54) METHOD AND SYSTEM FOR REPLACEMENT OF MEMORY CELLS

(71) Applicant: TAIWAN SEMICONDUCTOR MANUFACTURING CO., LTD., Hsinchu (TW)

(72) Inventor: Hiroki Noguchi, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 17/740,302

(22) Filed: May 9, 2022

(65) Prior Publication Data

US 2022/0270701 A1    Aug. 25, 2022

Related U.S. Application Data

(63) Continuation of application No. 17/011,991, filed on Sep. 3, 2020, now Pat. No. 11,328,788.

(60) Provisional application No. 62/981,731, filed on Feb. 26, 2020.

(51) Int. Cl.
| | |
|---|---|
| G11C 29/20 | (2006.01) |
| G11C 29/42 | (2006.01) |
| G11C 29/00 | (2006.01) |
| G11C 29/44 | (2006.01) |

(52) U.S. Cl.
CPC ............ *G11C 29/42* (2013.01); *G11C 29/20* (2013.01); *G11C 29/44* (2013.01); *G11C 29/72* (2013.01)

(58) Field of Classification Search
CPC ......... G11C 29/42; G11C 29/20; G11C 29/72; G11C 29/44
See application file for complete search history.

(56) References Cited

U.S. PATENT DOCUMENTS

| | | | | |
|---|---|---|---|---|
| 4,819,154 A | * | 4/1989 | Stiffler | G06F 11/1435 |
| | | | | 711/E12.04 |
| 6,584,015 B2 | * | 6/2003 | Katayama | G06F 11/1068 |
| | | | | 714/E11.049 |
| 8,537,627 B2 | * | 9/2013 | Ouellette | G11C 29/787 |
| | | | | 365/225.7 |
| 2005/0018517 A1 | | 1/2005 | Collura et al. | |
| 2005/0204212 A1 | | 9/2005 | Noguchi et al. | |

* cited by examiner

*Primary Examiner* — Mohammed A Bashar
(74) *Attorney, Agent, or Firm* — Maschoff Brennan

(57) ABSTRACT

A memory system is provided. The memory system includes a compare circuit and a control circuit. The compare circuit determines, in response to a number of detected error bits in a read data from a first memory array, whether a fail word address associated with the detected error bits is in an error table. The control circuit increments a counter value corresponding to the fail word address when the fail word address is in the error table, and further compares the counter value with a threshold value to replace memory locations, corresponding to the fail word address, in the first memory array with backup memory locations in a second memory array.

20 Claims, 6 Drawing Sheets

METHOD AND SYSTEM FOR REPLACEMENT OF MEMORY CELLS

CROSS-REFERENCE TO RELATED APPLICATION

The present application is a continuation of U.S. patent application Ser. No. 17/011,991, filed Sep. 3, 2020, now U.S. Pat. No. 11,328,788, issued May 10, 2022, which claims priority to U.S. Provisional Patent Application No. 62/981,731, filed on Feb. 26, 2020, which is incorporated by reference herein in its entirety.

BACKGROUND

The semiconductor integrated circuit (IC) industry has produced a wide variety of digital devices to address issues in a number of different areas. Some of these digital devices, such as memory systems, are configured for the storage of data. In the memory systems, data elements or locations in memory can become defective over time. Such defects can be detected and repaired during the manufacturing process (i.e., at time zero) and during normal operation by using error correction code (ECC) systems.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
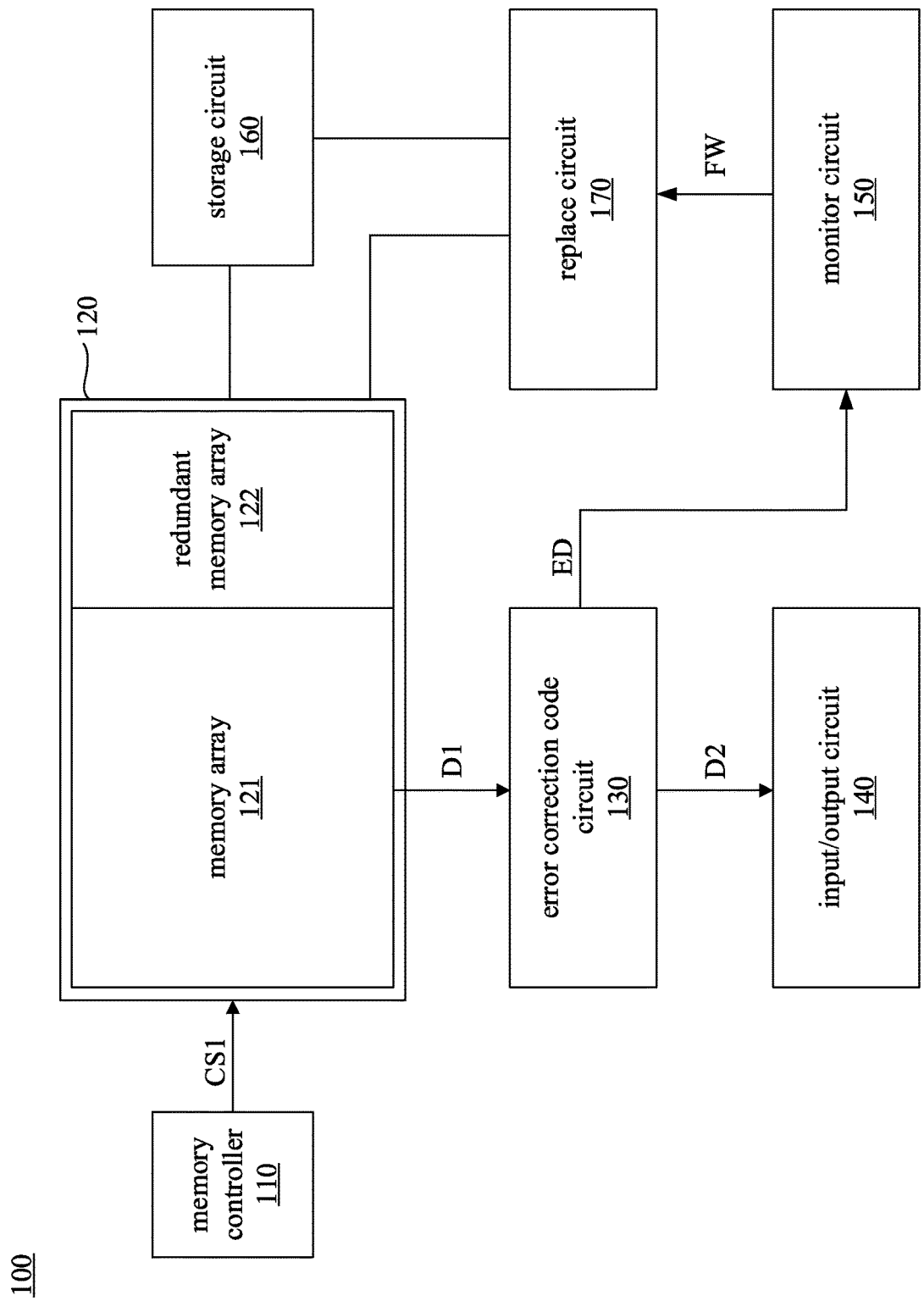
FIG. 1 is a schematic diagram of a memory system in accordance with various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

As used herein, the terms "comprising," "including," "having," "containing," "involving," and the like are to be understood to be open-ended, i.e., to mean including but not limited to.

As used herein, "around", "about", "approximately" or "substantially" shall generally refer to any approximate value of a given value or range, in which it is varied depending on various arts in which it pertains, and the scope of which should be accorded with the broadest interpretation understood by the person skilled in the art to which it pertains, so as to encompass all such modifications and similar structures. In some embodiments, it shall generally mean within 20 percent, preferably within 10 percent, and more preferably within 5 percent of a given value or range. Numerical quantities given herein are approximate, meaning that the term "around", "about", "approximately" or "substantially" can be inferred if not expressly stated, or meaning other approximate values.

Memory access is a bottleneck in performance and power consumption of processor cores. There is a tendency for memories to have a larger capacity, along with which there is a problem of increase in leakage current of the memories. Magnetoresistive Random-Access Memories (MRAMs) that attract attention as a candidate are a non-volatile memory, having a feature of much smaller leakage current than Static random-access memories (SRAMs) currently used in memories. Furthermore, the MRAMs are excellent in speed compared to other non-volatile memories and also excellent in area efficiency compared to conventional memories. Since the MRAMs can have a larger capacity, the MRAMs are expected to be built in the processor cores, as a memory. However, the MRAMs have a problem of a higher frequency of occurrence of bit errors than the SRAMs. Therefore, the MRAMs require an ECC (Error Check and Correction) circuit. An error correction processed by the ECC circuit and memory access has to be performed one after another, which causes increase in latency of memory access.

In addition, the bit errors are categorized into a soft error type and a hard fault type. A soft error occurs when a stored logical state of the MRAM cell is upset and changes, such as from logical one to logical zero or from logical zero to logical one. A hard error occurs when the MRAM cell becomes stuck at one logical state and will not change to another logical state to store a data bit. The ECC circuit is able to correct a number of error bits of the soft error type. For example, in some approaches, a maximum number of error bits correctable by the ECC circuit is 5. The ECC circuit corrects less than or equal to 5 error bits in data received from a memory array and correspondingly output a corrected data to an input/output circuit. In contrast, once the number of error bits in the data is more than the maximum number of error bits correctable by the ECC circuit, for example, more than 5 error bits, the memory array is determined to have bit errors of the hard fault type, and will be considered to be replaced by a redundant memory arrays disposed in a backup area. In some approaches, resources of redundant memory arrays in the backup area are limited and less than about 1% of the amount of the main arrays. Alternatively stated, few hard-fault memory arrays are possibly replaced by limited redundant memory arrays. Therefore, making the best use of the redundant memory arrays for necessary main arrays is a big issue.

The present disclosure provides a memory system and a method by utilizing a monitor circuit to record fail word addresses associated with some memory cells having soft fault type errors. Compared with replacing uncorrectable memory cells having the hard-fault, based on the recorded fail word addresses, a replace circuit is configured to replace memory locations associated with the recorded fail word addresses with backup memory locations before the memory cells become uncorrectable. Accordingly, the normal operation of the memory device is not stuck due to memory cell's hard faults and the resources of redundant memory arrays are assigned for necessary memory cells in main memory arrays.

Reference now is made to FIG. 1. FIG. 1 is a schematic diagram of a memory system 100 in accordance with various embodiments of the present disclosure. As illustratively shown in FIG. 1, the memory system 100 includes a memory controller 110, a memory device 120, an error correction code circuit 130, an input/output circuit 140, a monitor circuit 150, a storage circuit 160, and a replace circuit. The memory device 120 includes a (main) memory array 121 and a redundant memory array 122. In some embodiments, the memory controller sends a control signal CS1 to the memory device 120 to access the memory array 121 and the redundant memory array 122. The memory device 120 transmits a data signal D1 to the error correction code circuit 130. The error correction code circuit 130 detects error bits in the data signal D1 and sends a corrected data signal D2 to the input/output circuit 140 for outputting a stored data according to the corrected data signal D2. The error correction code circuit 130 further sends an error determination signal ED to the monitor circuit 150. The monitor circuit 150 sends, in response to the error determination signal ED, a fail word address FW associated with the error bits to the replace circuit 170. Illustratively, the storage circuit 160 is coupled to the memory device 120. The replace circuit 170 is coupled to the memory device 120 and the storage circuit 160. The configurations of the elements in FIG. 1 will be discussed in detail in the following paragraphs.

The memory controller 110 is configured to perform a read operation and a write operation to the memory device 120. Specifically, in the case of the read operation, a memory address is provided to the memory device 120 to read data out from memory locations therein associated with the memory address. The memory locations correspond to memory cells in the memory array 121. In the case of the write operation, the memory address is provided to the memory device 120 to write data into memory locations therein associated with the supplied memory address.

In some embodiments, the memory controller 110 interfaces with the error correction code circuit 130, the input/ output circuit, the monitor circuit 150, the storage circuit 160, and the replace circuit 170 for configuring memory device 120. In some embodiments, the memory controller 110 includes a hardware processor and a non-transitory, computer readable storage medium encoded with, i.e., storing, a set of executable instructions. In some embodiments, the memory controller 110 is separate from the memory device 120. In various embodiments, the memory controller 110 is integrated with the elements of FIG. 1.

The memory array 121 and the redundant memory array 122 include a plurality of banks of memory cells. Each bank includes a number of rows, a number of columns and related circuitry such as word lines, bit lines, or the like. In some embodiments, a row of memory cells is called a data word. For example, as discussed above, the row of memory cells having memory locations are accessed by the memory controller 110 with the control signal CS1 including the memory address. In some embodiments, a number of memory cells in the redundant memory array 122 is about 1% to about 10% of a number of memory cells in the memory array 121. In some embodiments, the memory array 121 and the redundant memory array 122 are non-volatile memories. In some embodiments, the memory array 121 and the redundant memory array 122 include resistive random access memory (RRAIVI), magnetoresistive RAM (MRAM), phase-change RAM (PRAM), ferroelectric RAM (FRAM), or other suitable memory types. Other memory types are within the scope of various embodiments.

The configurations of FIG. 1 are given for illustratively purposes. Various implements of the present disclosure are within the contemplated scope of the present disclosure. For example, in some embodiments, the redundant memory array 122 is an external memory which is disposed outside of the memory device 120, instead of being arranged adjacent to the memory array 121.

Figure 2:
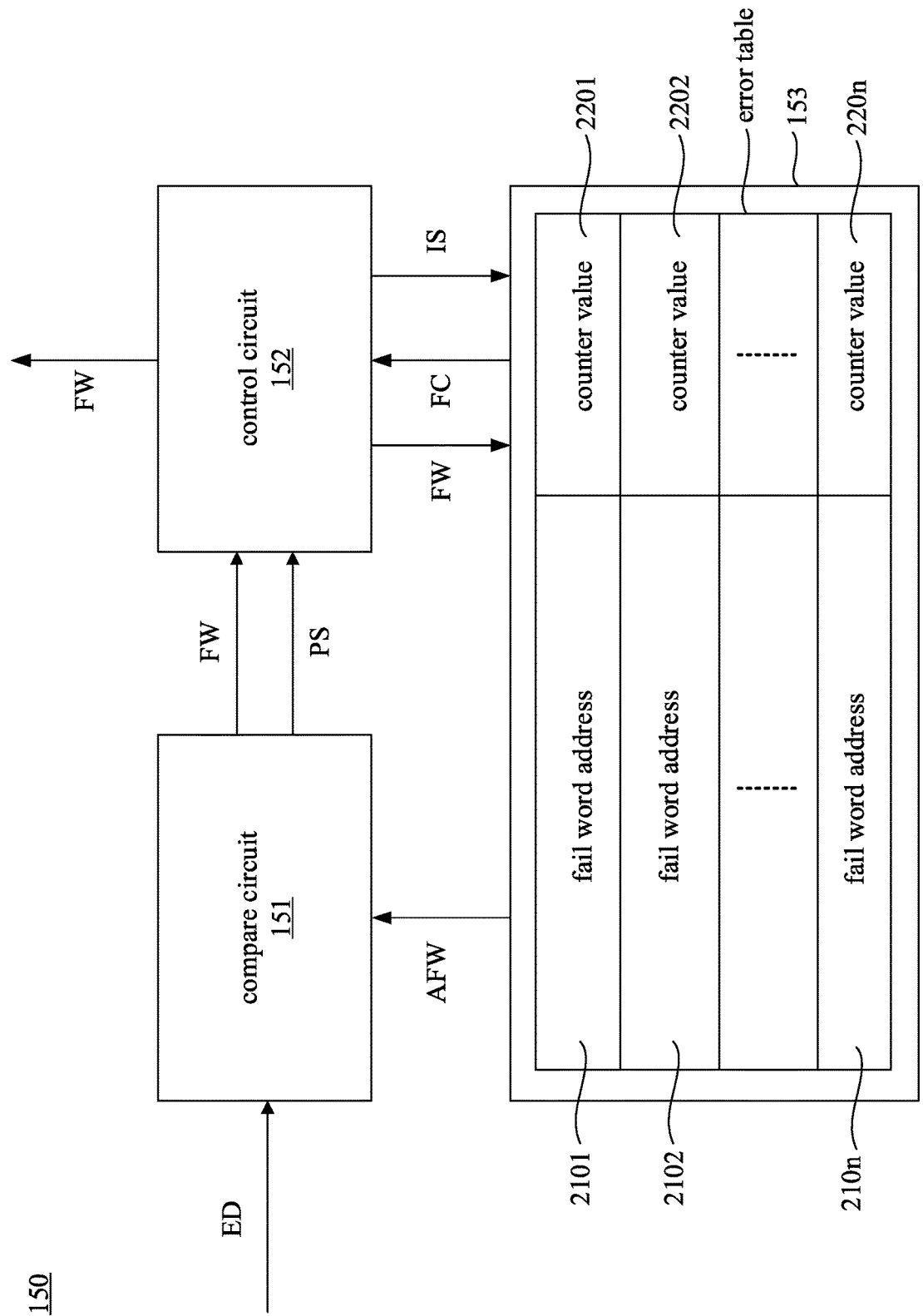
FIG. 2 is a detailed schematic diagram of a monitor circuit in the memory system of FIG. 1 in accordance with various embodiments of the present disclosure.

Reference is now made to FIG. 2. FIG. 2 is a detailed schematic diagram of the monitor circuit 150 in the memory system 100 of FIG. 1 in accordance with various embodiments of the present disclosure. With respect to the embodiments of FIG. 1, like elements in FIG. 2 are designated with the same reference numbers for ease of understanding.

For illustration, the monitor circuit 150 includes a compare circuit 151, a control circuit 152, and a storage unit 153 including an error table. In some embodiments, the compare circuit 151 receives the error determination signal ED and outputs the fail word address FW and a comparison signal PS to the control circuit 152. In response to the fail word address FW and the comparison signal PS, the control circuit 152 outputs the fail word address FW and an increment signal IS to the storage unit 153 for writing information associated with the fail word address FW. The control circuit 152 further reads out counter values as a fail count signal FC. By comparing the counter values with a threshold value, the control circuit 152 further outputs the fail word address FW to the replace circuit 170.

Figure 3:
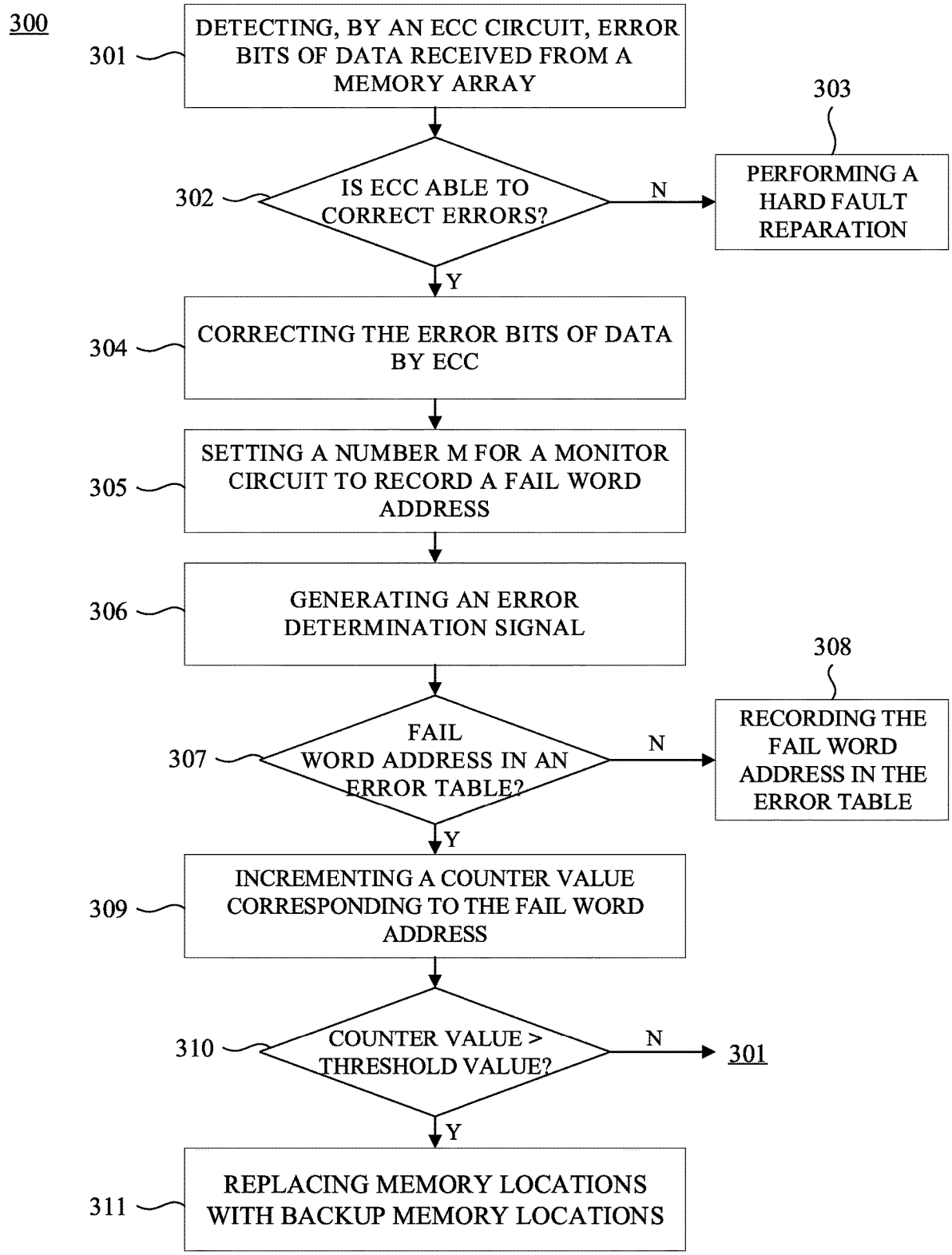
FIG. 3 is a flowchart of a method, in accordance with some embodiments of the present disclosure.

The detailed operations of the elements in FIGS. 1-2 will be discussed with reference to FIG. 3. FIG. 3 is a flowchart of a method 300 for operating the memory system 100 of FIG. 1, in accordance with some embodiments of the present disclosure. It is understood that additional operations can be provided before, during, and after the processes shown by FIG. 3, and some of the operations described below can be replaced or eliminated, for additional embodiments of the method. The order of the operations/processes may be interchangeable. Throughout the various views and illustrative embodiments, like reference numbers are used to designate like elements. The method 300 includes operations 301-312.

In operation 301, during the normal operation of the memory system 100, the error correction code circuit 130 is configured to detect error bits of data received from the memory array 121. For example, the error correction code circuit 130 receives the data, i.e., [10011011] from the memory array 121 through the data signal D1, as shown in FIG. 1. By comparing the received data and the desired data [10000011], the error correction code circuit 130 detects two error bits in the data [10011011], in which the error bits are marked underlined.

After the error correction code circuit 130 notifies the errors in the data, in operation 302, the error correction code circuit 130 is determined able to correct error bits or not. Specifically, the error correction code circuit 130 is configured to correct a maximum of N error bits in the data. When a number of error bits in the data is greater than the maximum number of error bits able to be corrected by the error correction code circuit 130, the operation 303 is performed. In contrast, when a number of error bits in the data is smaller than/equal to the maximum number of error bits able to be corrected by the error correction code circuit 130, the operation 304 is performed. As an example, the error correction code circuit 130 is configured to correct a maximum of 3 error bits. Accordingly, when there are four error bits, greater than 3, in the data, the operation 303 is performed. When there are two error bits, as discussed above, the operation 304 is performed.

In operation 303, a hard fault reparation is performed by the replace circuit 170. Alternatively stated, the error correction code circuit 130 is not able to correct error bits in the data, and the original row of the memory cells in the memory array 121 corresponding to the error bits are replaced by a row of backup memory cells in the redundant memory array 122.

When the error correction code circuit 130 is able to correct the error bits, the operation 304 is performed to correct the error bits in the data and a corrected data is generated and sent as the data signal D2 to the input/output circuit 140. For example, in the aforementioned embodiments, the fail data [10011011] is corrected to be the accurate data [10000011] which is the same as the desired data and sent to the input/output circuit 140. In some embodiments, the input/output circuit 140 is implemented by including sense amplifiers, multiplexers, the combinations thereof, or other suitable circuits to input/output data to/from the error correction code circuit 130.

In operation 305, the monitor circuit 150 is set to record or monitor multiple fail word addresses associated with M error bits. For example, in the aforementioned embodiments, the number M is set as 2 and the monitor circuit 150 is configured to record the fail word addresses associated with 2 error bits.

As discussed above, the error correction code circuit 130 is capable to correct N error bits. In some embodiments, the number M for the monitor circuit 150 to monitor fail word addresses is lower than the number N. For example, in various embodiments, the error correction code circuit 130 is capable to correct 3 error bits. However, data from the memory cells of the memory array 121 are frequently detected 2 error bits rather than 3 error bits. Accordingly, in order to accurately monitoring the situations of the memory cells, the monitor circuit 150 is set to record the fail word addresses associated with 2 error bits. The configurations mentioned above are given for illustratively purposes. Various implements are within the contemplated scope of the present disclosure. For example, in some embodiments, the number M is equal to the number N.

In operation 306, after setting the monitor circuit 150 for recording the fail word addresses associated with M error bits, the error correction code circuit 130 is configured to generate the error determination signal ED to the monitor circuit 150, as shown in FIG. 1. For example, in aforementioned embodiments, the error correction code circuit 130 corrects the data having 2 error bits and generates the error determination signal ED having the fail word address associated with 2 error bits.

In operation 307, as shown in FIG. 2, the compare circuit 151 of the monitor circuit 150 receives the error determination signal ED and determines, in response to the error determination signal ED, whether the fail word address is in the error table. For example, in some embodiments, the compare circuit 151 obtains all fail word addresses in the error table stored in the storage unit 153 through a signal AFW. By comparing the received fail word address with the stored fail word addresses, the compare circuit 151 determines that the received fail word address is not in the error table, the operation 308 is performed. In contrast, when the received fail word address is in the error table, the operation 309 is performed.

In operation 308, the fail word address is recorded in the error table. For example, as shown in FIG. 2, the compare circuit 151 sends the fail word address FW to the control circuit 152. The control circuit 152 records the fail word address FW in a fail word address 2101 and a corresponding failure time is recorded as a counter value 2201 in the error table. In some embodiments, the counter value 2201 is set as 1 when the fail word address 2101 is added in the error table. When another fail data is detected and another fail word address is sent to the control circuit 152, another fail word address is recorded in a fail word address 2102 and a corresponding failure time is recorded as a counter value 2202 in the error table. In various embodiments, the error table includes n fail word address 2101-210$n$ and corresponding counter values 2201-220$n$. The number n corresponds to a storage capacity of the storage unit 153.

With continued reference to FIG. 3, when the receive fail word address FW is determined recorded in the error table, the operation 309 is performed. In operation 309, a counter value corresponding to the received fail word address is incremented. For example, as shown in FIG. 2, the compare circuit 151 determines that the received fail word address is the same as the fail word address 2101 which has the corresponding counter value 2201 of 1. The compare circuit 151 outputs the comparison signal PS to the control circuit 152. The control circuit 152 generates, in response to the comparison signal PS, the increment signal IS to increment the corresponding counter value 2201 by 1. Accordingly, the counter value 2201 becomes 2.

As discussed above, in some embodiments, the operations 308-309 are referred to as the operation of counting the counter values associated with the fail word addresses.

In operation 310, the control circuit is further configured to determine whether one or more the counter values are greater the threshold value. When a certain counter value is equal to or smaller than the threshold value, the operation 301 is performed. In contrast, when the counter value is greater than the threshold value, the operation 311 is performed. For example, as shown in FIG. 2, the control circuit 152 obtains the counter values from the error table by the fail count signal FC. The threshold value is set as 250 (i.e., 8-bit counter), in some embodiments. When one counter value, for example, the counter value 2202 having a value of 230, is smaller than the threshold value of 250, the operation 301 is performed. In contrast, when one counter value, for example, the counter value 2201 having a value of 255, is greater than the threshold value of 250, the operation 311 is performed.

In some embodiments, the threshold value is set by the fab before shipping. In various embodiments, the threshold value is determined to be lower than a certain experimental value. For example, in some embodiments, based on the experimental results, the memory cells have a hard fault after detecting error bits for 512 times. Correspondingly, the threshold value is set as 250 lower than 512. The configurations of the threshold value are given for illustrative purposes. Various implements are within the contemplated scope of the present disclosure. For example, in some embodiments, the threshold value is configured to be value of about 124 to about 1024.

In some embodiments, the higher the counter value is, the greater risky the corresponding memory cells associated with the fail word address are. As an example, error bits are continuously detected by the error correction code circuit 130 and the corresponding fail word address is recorded. This implies that the corresponding memory cells in the memory array 121 easily encounter faults during writing and/or read operation and therefore generate error bits. Although the error correction code circuit 130 is capable to correct the error bits, those memory cells are considered as risky memory cells and may probably deteriorate after experiencing more read and write operations. Accordingly, risky memory cells are required to be replaced before the number of error bits exceeds the number of bits able to be corrected by the error correction code circuit 130 and the data becomes uncorrectable.

In some embodiments, as shown in FIGS. 1-2, the control circuit 152 of the monitor circuit 150 is configured to transfer the fail word address FW, corresponding to the exceeding counter value, to the replace circuit 170.

In operation 311, the memory locations in the memory array 121, corresponding to the fail word address FW, are replaced by backup memory locations in the redundant memory array 122. For example, in some embodiments, as shown in FIG. 1, the storage circuit 160 saves the backup memory locations. The replace circuit 170 obtains the backup memory locations in the redundant memory array 122 from the storage circuit 160 and selects the available redundant memory locations to replace the fail memory locations of the memory array 121 corresponding to the fail word address. Accordingly, whenever the fail word address is transmitted to the memory device 120 for accessing data, the selected redundant memory locations are accessed instead of the original fail memory locations of the memory array 121. Alternatively stated, the original memory cells in the memory array 121 are replaced by the backup memory cells in the redundant memory array 122 for storing the data, when the replace circuit 170 re-directs the word address to point to the selected backup locations of the redundant memory array 122.

In some embodiments, the method 300 further includes operations of sending and writing the corrected data in the selected backup locations of the redundant memory array 122. For example, in some embodiments, after the replace circuit 170 selects the backup locations and re-routes the word address to the backup memory cells of the redundant memory array 122, the error correction code circuit 130 further sends the corrected data signal D2 to the redundant memory array 122 and the corrected data therefore is written into the backup memory cells of the redundant memory array 122. As a result, the normal read and write operation continue.

In some embodiments, the method 300 further includes an operation of removing the corresponding fail word addresses from the error table. For example, the fail word address 2101 is removed from the error table after the corresponding original memory cells are replaced by the backup memory cells.

Because manufacture processes and characteristics of memory cells in a memory array are different, the endurances and the reliabilities of the memory cells vary. In some approaches, high risky cells are determined by testing before shipping and corresponding word addresses are stored in advance in a storage circuit. Accordingly, based on the stored word addresses, a replace circuit replaces the high risky cells with backup memory cells at a certain time. Alternatively stated, the replace operation is performed according to tested data obtained before shipping, instead of considering the real-time usage conditions. As a result, while some health memory cells, not determined as risky cells, deteriorate after many read and write operations and become uncorrectable, those uncorrectable cells are not replaced due to the absence of corresponding word address in the storage circuit. In contrast, the replace circuit replaces those memory cells which are determined high risky before shipping but probably not risky in real time, when those memory cells experience less operations, compared with those deteriorated memory cells.

With the configurations of various embodiments of the present disclosure, the monitor circuit 150 monitors and records the fail word addresses based on the error determination signal from the error correction code circuit 130 in real-time operations. Memory cells generating more error bits are traced dynamically and are determined high risky cells. Accordingly, when the corresponding counter values are greater than the threshold value, those memory cells are replaced in advance to prevent generating more fail bits. Alternatively stated, before the memory cells become uncorrectable, the backup memory cells take over the risky memory cells to store data. Based on the discussion above, the present disclosure provides a more effective and dynamic way to monitor memory cells, compared with some approaches.

The configurations of FIG. 3 are given for illustrative purposes. Various implements are within the contemplated scope of the present disclosure. For example, in some embodiments, the operation 305 is performed before the operation 301. In various embodiments, the operations 302 and 303 are omitted and the operation 304 is performed directly after the operation 301.

Figure 4:
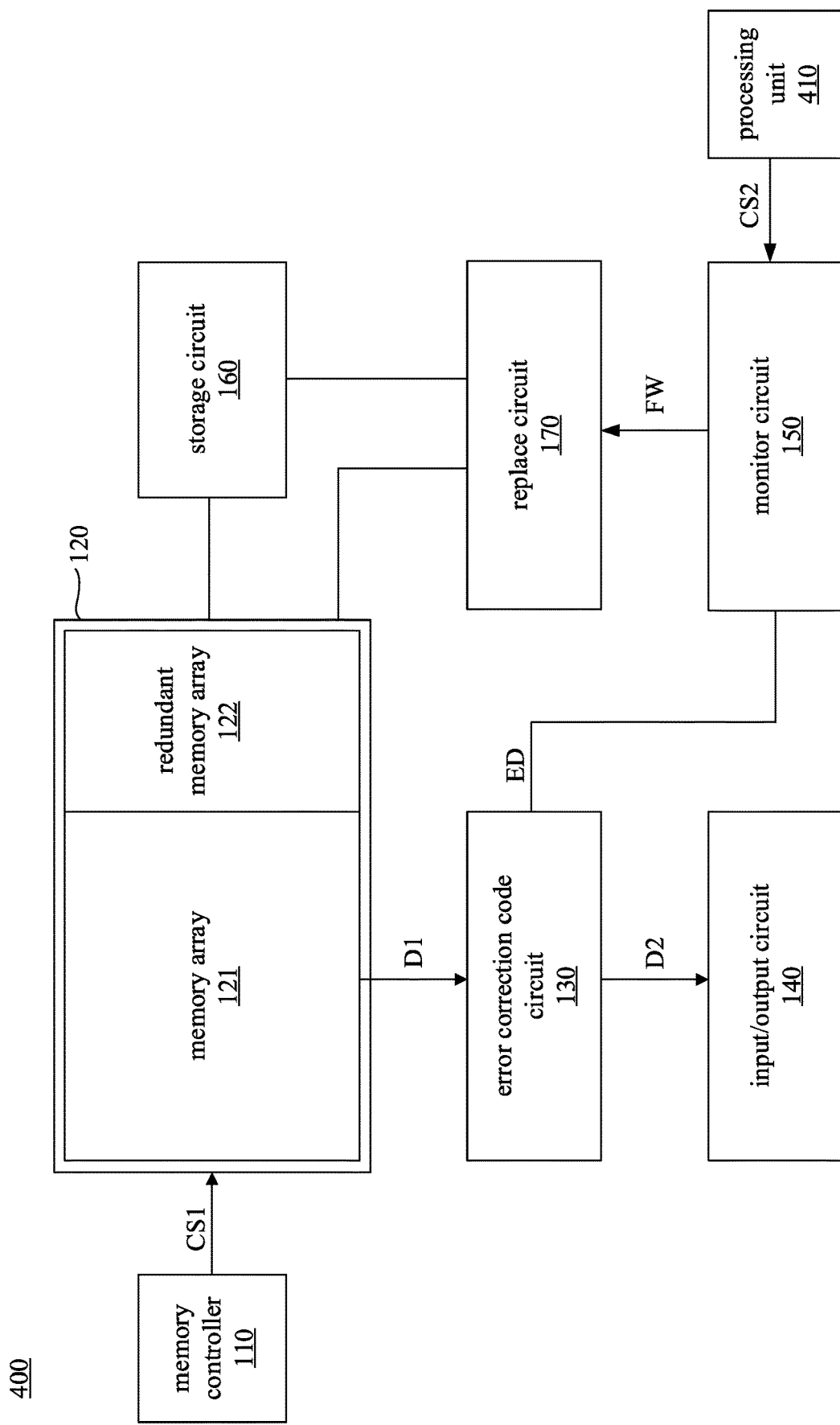
FIG. 4 is a schematic diagram of a memory system in accordance with various embodiments of the present disclosure.

Reference is now made to FIG. 4. FIG. 4 is a schematic diagram of a memory system 400 in accordance with various embodiments of the present disclosure. With respect to the embodiments of FIGS. 1-3, like elements in FIG. 4 are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 4.

Compared with FIG. 1, the memory system 400 further includes a processing unit 410. For illustration, the processing unit 410 is coupled to the monitor circuit 150. The processing unit 410 is configured to set the monitor circuit 150 by a control signal CS2 to read fail word addresses associated with M error bits in the error table. For example, in some embodiments, the number M equals to 2, and the monitor circuit 150 records all fail word addresses associated with 2 error bits. In various embodiments, the monitor circuit 150 is pre-set to record fail word addresses associated with 2 error bits while the error correction code circuit 130 is capable to correct the maximum of 5 error bits. The processing unit 410 is further configured to adjust the number M to be equal to the maximum number of error bits being corrected by the error correction code circuit 130. As the embodiments discussed above, the M is adjusted to be 5 by the processing unit 410, and the monitor circuit 150 is set to record fail word addresses associated with 5 error bits.

The configurations of FIG. 4 are given for illustrative purposes. Various implement are within the contemplated scope of the present disclosure. For example, in some embodiments, the processing unit 410 is integrated in the memory controller 110 and the memory controller 110 is coupled to the monitor circuit 150.

Figure 5:
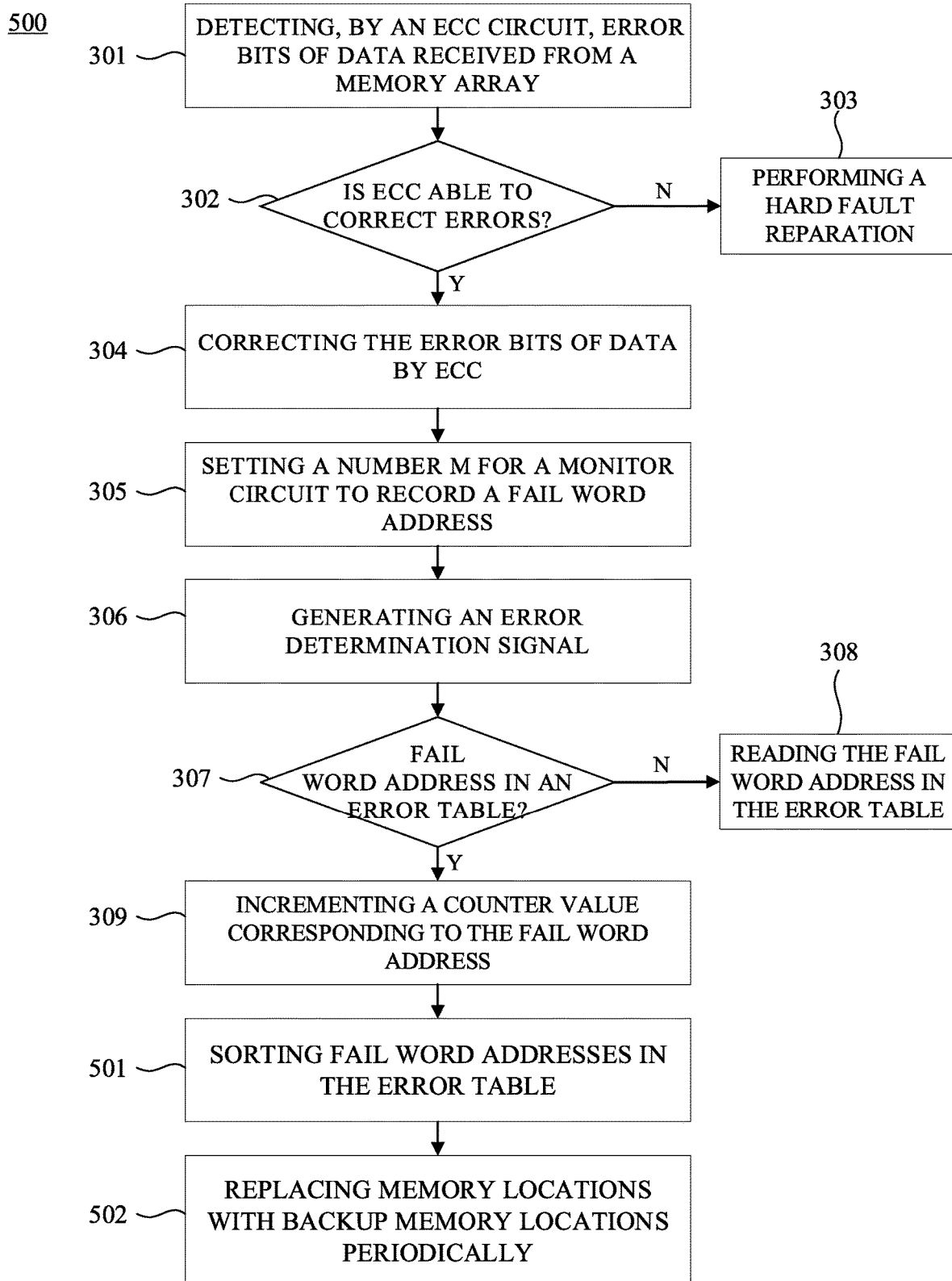
FIG. 5 is a flowchart of a method, in accordance with some embodiments of the present disclosure.

Reference is now made to FIG. 5. FIG. 5 is a flowchart of a method 500 for operating the memory system 400 of FIG. 4, in accordance with some embodiments of the present disclosure. With respect to the embodiments of FIGS. 1-4, like elements in FIG. 5 are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 5.

Compared with the method 300 of FIG. 3, instead of having the operation 310, the method 500 includes the operations 501-502 performed after the operation 309. In some embodiments, after having the fail word addresses and the counter values, the operation 501 is performed by the monitor circuit 150 to sort the recorded fail word addresses based on the counter values in descending order. For example, in the embodiments shown in FIG. 2, when the counter values 2201-2204 are 200, 250, 50, and 210 separately and the counter values 2205-220n are below 50, the monitor circuit 150 re-arranges the counter values 2201-220n in descending order to place the counter value 2202 of 250 at the first place, the counter value 2204 of 210 at the second place, the counter value 2201 of 200 at the third place, and the counter value 2203 of 50 at the fourth place. Accordingly, the monitor circuit 150 re-arranges the fail word address 2102 corresponding to the counter value 2202 at the first place, the fail word address 2104 corresponding to the counter value 2204 at the second place, the fail word address 2101 corresponding to the counter value 2201 at the third place, and the fail word address 2103 corresponding to the counter value 2203 at the fourth place. Alternatively stated, the fail word address having the largest counter value is listed in the top entry of the error table.

After sorting, in operation 502, the replace circuit 170 replaces memory locations corresponding to the fail word address in the top entry of the error table periodically. For example, in the first period, the replace circuit 170 replaces memory locations corresponding to the fail word address 2102 with backup memory locations, and the fail word address 2102 will be removed. Then, in the second period, if there is no counter value greater than the 2204, the replace circuit 170 therefore replaces memory locations corresponding to the fail word address 2104 with backup memory locations. Accordingly, the memory cells having highest risk are automatically replaced by the healthy backup memory cells for storing data. In some embodiments, the processing unit 410 is also coupled to the replace circuit 170 to determine the period of replacing operation.

The configurations of FIG. 5 are given for illustrative purposes. Various implements are within the contemplated scope of the present disclosure. For example, in some embodiments, instead of having the operation 501, the method 500 includes an operation of determining the fail word address having a corresponding maximal counter value. Accordingly, in operation 502, the replace circuit 170 performs replacement operation to the memory cells associated with the fail word address having the corresponding maximal counter value.

Figure 6:
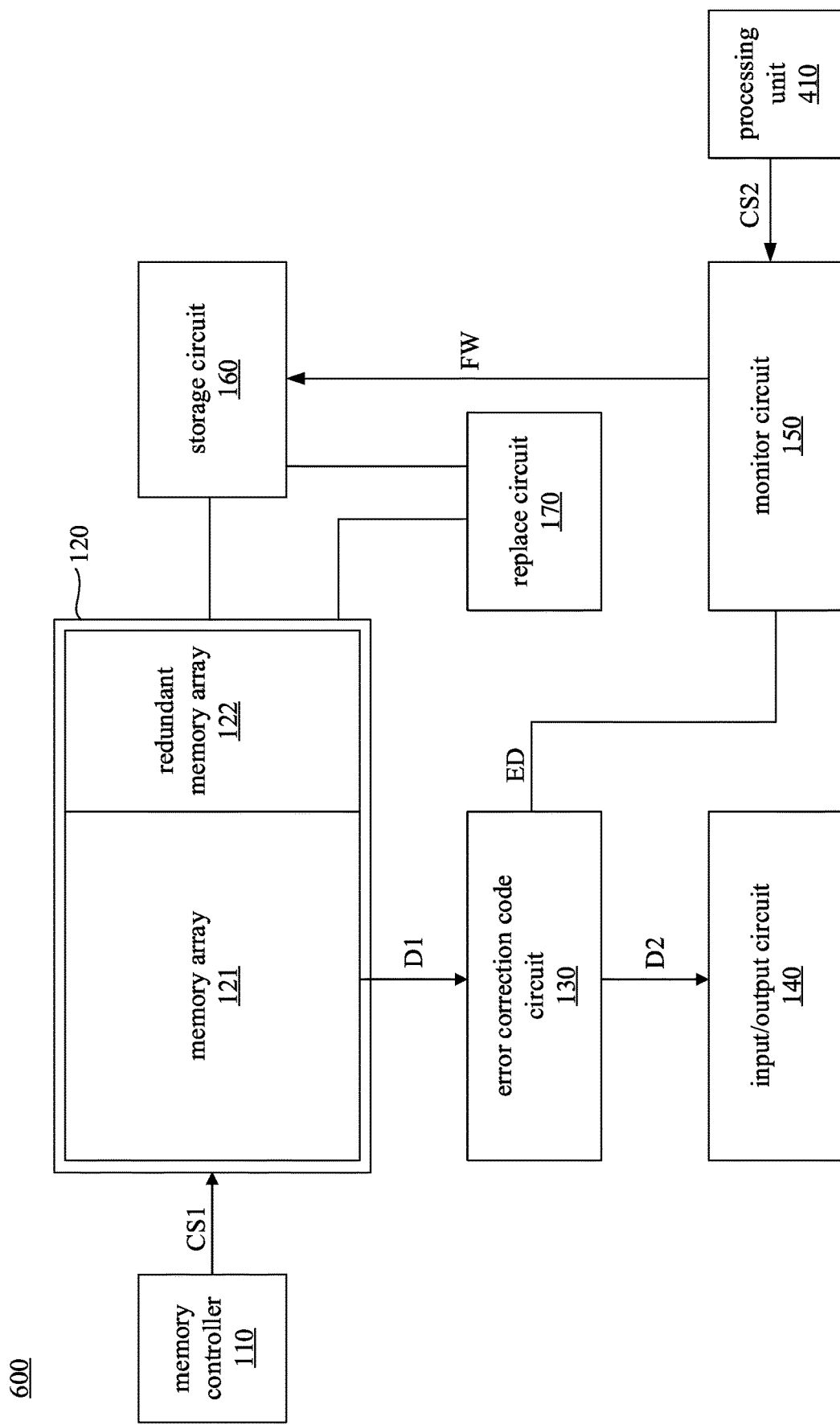
FIG. 6 is a schematic diagram of a memory system in accordance with various embodiments of the present disclosure.

Reference is now made to FIG. 6. FIG. 6 is a schematic diagram of a memory system 600 in accordance with various embodiments of the present disclosure. With respect to the embodiments of FIGS. 1-5, like elements in FIG. 6 are designated with the same reference numbers for ease of understanding.

Compared with the memory system 400 of FIG. 4, the monitor circuit 150 of the memory system 600 is coupled to the storage circuit 160. In some embodiments, the storage circuit 160 includes a repair information listing word addresses associated with risky memory cells needed to be replaced. The memory cells are determined risky before shipping. As shown in FIG. 6, the monitor circuit 150 dynamically monitors the memory device 120 and determines that the counter value of the fail word address FW is greater than the threshold value. The monitor circuit 150 sends the fail word address FW to update the repair information with the fail word address FW. Accordingly, the repair information includes word addresses corresponding to the real-time risky memory cells, and the replace circuit 170 further replaces memory locations based on the listed word addresses in the storage circuit 160.

As discussed above, in some embodiments, some memory cells monitored by the monitor circuit 150 are determined risky in real-time operations, while those memory cells are probably not determined as risky cells before shipping. Correspondingly, the (fail) word addresses associated with those memory cells are not listed in the repair information. Alternatively stated, in some embodiments, one of the fail word addresses in the error table is different from the word addresses stored in the repair information before shipping.

The configurations of FIG. 6 are given for illustrative purposes. Various implements are within the contemplated scope of the present disclosure. For example, in some embodiments, the monitor circuit 150 of FIG. 6 is coupled to the replace circuit 170. The monitor circuit 150 also sends the fail word address FW to the replace circuit 170 for replacement operations.

As described above, a memory system of the present disclosure dynamically monitors a memory array and records word addresses associated with risky memory cells in the memory array by utilizing a monitor circuit. A replace circuit replaces the risky memory cells according to the word addresses recorded in the monitor circuit before the memory cells become uncorrectable. Therefore, the memory system of the present disclosure provides a stable and reliable system for storing data by preventing occurrence of hard faults of memory cells in advance.

In some embodiments, a memory system is disclosed. A memory system is provided. The memory system includes a compare circuit and a control circuit. The compare circuit determines, in response to a number of detected error bits in a read data from a first memory array, whether a fail word address associated with the detected error bits is in an error table. The control circuit increments a counter value corresponding to the fail word address when the fail word address is in the error table, and further compares the counter value with a threshold value to replace memory locations, corresponding to the fail word address, in the first memory array with backup memory locations in a second memory array. In some embodiments, the memory system further includes an error correction code circuit configured to correct the number of detected error bits in the read data and configured to generate an error determination signal corresponding to the fail word address. In some embodiments, the memory system further includes a replace circuit configured to receive the fail word address from the control circuit to replace the memory locations, corresponding to the fail word address, in the first memory array with the backup memory locations in the second memory array. In some embodiments, the control circuit is further configured to record the fail word address and the counter value in the error table. In some embodiments, the memory system further includes a storage circuit configured to receive the fail word address to update a repair information; and a replace circuit configured to perform a replacing operation to replace the memory locations based on the repair information. In some embodiments, the memory system further includes a processing unit configured to determine a period of the replacing operation. In some embodiments, the memory system further includes an error correction code circuit configured to correct a predetermined number of error bits in the number of detected error bits of the read data. The predetermined number and the number of detected error bits are different from each other. In some embodiments, the memory system further includes a storage unit configured to store the error table. The control circuit is further configured to obtain the counter value from the error table in the storage unit by sending a fail count signal to the storage unit.

Also disclosed a method. The method includes the operations below: recording a fail word address in an error table; adjusting a counter value associated with the fail word address, wherein the counter value indicates that a number of times the fail word address is recorded; and replacing a plurality memory locations corresponding to the fail word address with multiple backup memory locations. In some embodiments, the method further includes operations of correcting a maximum N number of error bits in a read data corresponding to the fail word address; and setting a number M to record the fail word address associated with M error bits. N and M are positive integers, and N is different from M. In some embodiments, the method further includes operations of adjusting the number M, in response to a control signal, to be equal to N. In some embodiments, the method further includes operations of adjusting the counter value associated with the fail word address includes determining whether the fail word address matches one of word addresses in the error table; and in response to the determination, incrementing the counter value corresponding to the fail word address. In some embodiments, the method further includes operations of after replacing, removing the fail word address from the error table. In some embodiments, the method further includes operations of comparing the counter value with a threshold value; and when the counter value is greater than the threshold value, updating a repair information with the fail word address.

Also disclosed is a method that includes the operations below: comparing a received fail word address with multiple fail word addresses in an error table to increment a corresponding counter value, associated with the received fail word address, in multiple counter values; sorting the fail word addresses based on the counter values; and replacing memory locations corresponding to a top fail word address, of the fail word addresses, in a top entry of the error table. In some embodiments, the corresponding counter value indicates how many times the corresponding fail word address is recorded in the error table. In some embodiments, replacing the memory locations corresponding to the top fail word address further includes replacing the memory locations periodically with multiple backup memory locations. In some embodiments, the method further includes operations of counting multiple counter values associated with the fail word addresses. Comparing the received fail word address with the fail word addresses includes: when the received fail word address is not in the error table, recording the received fail word address in the error table and setting the corresponding counter value being 1. In some embodiments, the method further includes operations of updating a repair information with the top fail word address. In some embodiments, the method further includes operations of removing the top fail word address after replacing the memory locations corresponding to the top fail word address.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory system, comprising:
   a compare circuit configured to determine, in response to a number of detected error bits in a read data from a first memory array, whether a fail word address associated with the detected error bits is in an error table; and
   a control circuit configured to increment a counter value corresponding to the fail word address when the fail word address is in the error table, and further configured to compare the counter value with a threshold value to replace memory locations, corresponding to the fail word address, in the first memory array with backup memory locations in a second memory array.

2. The memory system of claim 1, further comprising:
   an error correction code circuit configured to correct the number of the detected error bits in the read data and configured to generate an error determination signal corresponding to the fail word address.

3. The memory system of claim 1, further comprising:
   a replace circuit configured to receive the fail word address from the control circuit to replace the memory locations, corresponding to the fail word address, in the first memory array with the backup memory locations in the second memory array.

4. The memory system of claim 1, wherein the control circuit is further configured to record the fail word address and the counter value in the error table.

5. The memory system of claim 1, further comprising:
   a storage circuit configured to receive the fail word address to update a repair information; and
   a replace circuit configured to perform a replacing operation to replace the memory locations based on the repair information.

6. The memory system of claim 5, further comprising:
a processing unit configured to determine a period of the replacing operation.

7. The memory system of claim 1, further comprising:
an error correction code circuit configured to correct a predetermined number of error bits in the number of the detected error bits of the read data, wherein the predetermined number and the number of the detected error bits are different from each other.

8. The memory system of claim 1, further comprising:
a storage unit configured to store the error table,
wherein the control circuit is further configured to obtain the counter value from the error table in the storage unit by sending a fail count signal to the storage unit.

9. A method, comprising:
recording a fail word address in an error table;
adjusting a counter value associated with the fail word address, wherein the counter value indicates that a number of times the fail word address is recorded; and
replacing a plurality of memory locations corresponding to the fail word address with a plurality of backup memory locations.

10. The method of claim 9, further comprising:
correcting a maximum N number of error bits in a read data corresponding to the fail word address; and
setting a number M to record the fail word address associated with M error bits,
wherein N and M are positive integers, and N is different from M.

11. The method of claim 10, further comprising:
adjusting the number M, in response to a control signal, to be equal to N.

12. The method of claim 9, wherein adjusting the counter value associated with the fail word address comprises:
determining whether the fail word address matches one of word addresses in the error table; and
in response to the determination, incrementing the counter value corresponding to the fail word address.

13. The method of claim 9, further comprising:
after replacing, removing the fail word address from the error table.

14. The method of claim 9, further comprising:
comparing the counter value with a threshold value; and
when the counter value is greater than the threshold value, updating a repair information with the fail word address.

15. A method, comprising:
comparing a received fail word address with a plurality of fail word addresses in an error table to increment a corresponding counter value, associated with the received fail word address, in a plurality of counter values;
sorting the plurality of fail word addresses based on the plurality of counter values; and
replacing memory locations corresponding to a top fail word address, of the plurality of fail word addresses, in a top entry of the error table.

16. The method of claim 15, wherein the corresponding counter value indicates how many times the corresponding fail word address is recorded in the error table.

17. The method of claim 15, wherein replacing the memory locations corresponding to the top fail word address further comprises:
replacing the memory locations periodically with a plurality of backup memory locations.

18. The method of claim 15, further comprising:
counting the plurality of counter values associated with the plurality of fail word addresses,
wherein comparing the received fail word address with the plurality of fail word addresses comprises:
when the received fail word address is not in the error table, recording the received fail word address in the error table and setting the corresponding counter value being 1.

19. The method of claim 15, further comprising:
updating a repair information with the top fail word address.

20. The method of claim 15, further comprising:
removing the top fail word address after replacing the memory locations corresponding to the top fail word address.

* * * * *